(12) United States Patent
Omori et al.

(10) Patent No.: US 9,530,846 B2
(45) Date of Patent: Dec. 27, 2016

(54) NITRIDE SEMICONDUCTOR SUBSTRATE

(71) Applicant: CoorsTek KK, Tokyo (JP)

(72) Inventors: Noriko Omori, Hadano (JP); Hiroshi Oishi, Hadano (JP); Yoshihisa Abe, Hadano (JP); Jun Komiyama, Hadano (JP); Kenichi Eriguchi, Hadano (JP)

(73) Assignee: CoorsTek KK, Tokyo (JP)

( * ) Notice: Subject to any disclaimer, the term of this patent is extended or adjusted under 35 U.S.C. 154(b) by 0 days.

(21) Appl. No.: 15/084,119

(22) Filed: Mar. 29, 2016

(65) Prior Publication Data

US 2016/0293710 A1 Oct. 6, 2016

(30) Foreign Application Priority Data

Mar. 31, 2015 (JP) ................................. 2015-072914
Feb. 16, 2016 (JP) ................................. 2016-027459

(51) Int. Cl.
*H01L 29/20* (2006.01)
*H01L 29/32* (2006.01)
*H01L 29/04* (2006.01)

(52) U.S. Cl.
CPC .......... *H01L 29/2003* (2013.01); *H01L 29/045* (2013.01); *H01L 29/32* (2013.01)

(58) Field of Classification Search
CPC ....... H01L 29/32; H01L 29/34; H01L 29/2003
See application file for complete search history.

(56) References Cited

U.S. PATENT DOCUMENTS

| 8,044,492 B2 * | 10/2011 | Imanishi | H01L 21/02378 257/615 |
| 2006/0043396 A1 * | 3/2006 | Tsuda | H01L 29/045 257/94 |
| 2008/0179623 A1 * | 7/2008 | Tachibana | H01L 33/02 257/103 |
| 2008/0197359 A1 * | 8/2008 | Imanishi | H01L 21/02378 257/76 |
| 2009/0173951 A1 * | 7/2009 | Kikkawa | H01L 21/02378 257/77 |
| 2010/0051961 A1 * | 3/2010 | Kuraoka | H01L 21/02378 257/76 |

(Continued)

FOREIGN PATENT DOCUMENTS

JP 2012-15304 A 1/2012
JP 2013-12767 1/2013

*Primary Examiner* — Daniel Luke
(74) *Attorney, Agent, or Firm* — Westerman, Hattori, Daniels & Adrian, LLP

(57) ABSTRACT

A solution is formation of a nitride semiconductor layer on one principal plane of a single crystal substrate through a first layer. Upon selecting arbitrary three places in a radial direction from a cross section cleaved in a diameter portion and observing an interface between the first layer and the nitride semiconductor layer by taking a width of at least 500 nm in the radial direction, a value is within the range of 6 nm or more and 15 nm or less in a mean value of the three places with regard to a difference between a maximum height of a convex top portion and a minimum height of a concave bottom portion of the first layer in a thickness direction from the single crystal substrate toward the nitride semiconductor layer. A value is 10 nm or more and 25 nm or less in the mean value.

6 Claims, 2 Drawing Sheets

(56) References Cited

U.S. PATENT DOCUMENTS

2010/0163928 A1* 7/2010 Imada ................. H01L 29/0619
257/194
2012/0326165 A1* 12/2012 Nakata .............. H01L 21/02378
257/77
2013/0043489 A1* 2/2013 Kotani .............. H01L 21/02381
257/77

* cited by examiner

NITRIDE SEMICONDUCTOR SUBSTRATE

TECHNICAL FIELD

The present invention relates to a nitride semiconductor substrate having a nitride semiconductor layer formed on one principal plane of a single crystal substrate.

BACKGROUND ART

A nitride semiconductor such as GaN (gallium nitride) has high electron mobility, and preferable for a power system transistor such as a high electron mobility transistor (HEMT), for example.

The high electron mobility transistor is prepared by using a nitride semiconductor substrate in which a nitride semiconductor layer is formed on a different kind of substrate, for example. The nitride semiconductor substrate has structure in which an initial layer constituted of AlN (aluminum nitride), SiC (silicon carbide) or SiN (silicon nitride) is formed on one principal plane of a single crystal substrate constituted of Si (silicon), SiC or sapphire, and a nitride semiconductor layer of GaN or the like is formed on the initial layer.

CITATION LIST

Patent Literature

Patent Literature 1: JP 2013-12767 A
Patent Literature 2: JP 2012-15304 A

SUMMARY OF INVENTION

Technical Problem

Specific examples of electric characteristics required in the above high electron mobility transistor or the like include improvement of a withstand voltage, reduction of a leak electric current and improvement of current collapse. Technologies for improving the characteristics with well balance have been developed since long before, but improvement of performance described above has been required by means of simpler structure and further effectively.

The present invention has been made based on such a problem, and a first objective is to provide a nitride semiconductor substrate that can reduce the leak electric current, and improve the withstand voltage.

A second objective of the present invention is to provide a nitride semiconductor substrate that can further improve the current collapse.

In addition, Patent Literature 1 describes a compound semiconductor device having an AlN layer formed on a single crystal substrate, and a nitride semiconductor buffer layer formed on the AlN layer, in which concavity and convexity are higher in an interface between the AlN layer and the buffer layer in comparison with an interface between the single crystal substrate and the AlN layer, and skewness Rsk on a surface of the AlN layer is positive. In the above Patent Literature 1, an art has focused attention on interface structure between the AlN layer and the buffer layer. However, the art has features of enhancing the concavity and convexity in the interface between the AlN layer and the buffer layer in comparison with the interface between the single crystal substrate and the AlN layer, and is different from the present invention in a concept in which an art has features of further flattening a surface. Moreover, an objective of Patent Literature 1 is to increase a speed of recovery from high frequency signal interception, and the objective is also different from the present invention in which an objective is to reduce the leak electric current.

Moreover, Patent Literature 2 describes a semiconductor device having an AlN layer formed on a principal plane of a Si substrate, and a GaN layer formed on the AlN layer, in which a full width at half maximum (FWHM) of an X-ray rocking curve on a (002) plane of the AlN layer is 2,000 sec or less. However, while the FWHM of an X-ray rocking curve on the (002) plane of the AlN layer is further reduced in Patent Literature 2, the present invention is different therefrom in adjusting the FWHM within a predetermined range.

Solution to Problem

A nitride semiconductor substrate according to the present invention has a first layer formed on one principal plane of a single crystal substrate, and a nitride semiconductor layer formed on the first layer, in which, upon selecting arbitrary three places in a radial direction from a cross section cleaved in a diameter portion on the one principal plane of the nitride semiconductor substrate, and observing an interface between the first layer and the nitride semiconductor layer for each by taking a width of at least 500 nm in the radial direction, a value is within the range of 6 nm or more and 15 nm or less in a mean value of the three places with regard to a difference between a maximum height of a convex top portion of the first layer and a minimum height of a concave bottom portion thereof based on the one principal plane of the single crystal substrate, in a thickness direction from the single crystal substrate toward the nitride semiconductor layer, and a value is within the range of 10 nm or more and 25 nm or less in the mean value of the three places with regard to an interval in the radial direction between the convex top portion and the concave bottom portion adjacent to each other in cross sections in the three places.

Advantageous Effects of Invention

According to the present invention, a value is set to be 6 nm or more and 15 nm or less in a mean value of three places with regard to a difference between a maximum height of a convex top portion of a first layer and a minimum height of a concave bottom portion thereof, and a value is set to be 10 nm or more and 25 nm or less in a mean value of the three places with regard to an interval in a radial direction between the convex top portion and the concave bottom portion adjacent to each other. Therefore, the very fine uneven surface makes dislocations turn the propagation direction obliquely to the nitride semiconductor layer. Therefore, the dislocations are bent on the way, and joined with each other, and the dislocation progress extending upward can be reduced. Thus, a leak electric current can be reduced, and a withstand voltage can also be improved.

Moreover, if the first layer is constituted of AlN to adjust a FWHM of an X-ray rocking curve on a (002) plane so as to be 1,900 arcsec or less, the dislocation existing in the first layer is reduced, and the dislocation propagating into the nitride semiconductor layer can be reduced. Thus, the leak electric current can be further reduced. Further, if the FWHM of an X-ray rocking curve on the (002) plane is set to 1,000 arcsec or more, lattice misalignment can be relieved by the dislocation existing in the first layer, and warpage of the nitride semiconductor substrate can be reduced.

In addition thereto, if the first layer is constituted of AlN to adjust Si concentration to be within the range of $1 \times 10^{16}$ atoms/cm$^3$ or more and $1 \times 10^{17}$ atoms/cm$^3$ or less, deterioration of current collapse can be further effectively suppressed.

DESCRIPTION OF EMBODIMENTS

In the following, an embodiment of the present invention will be described in detail with reference to drawings.

Figure 1:
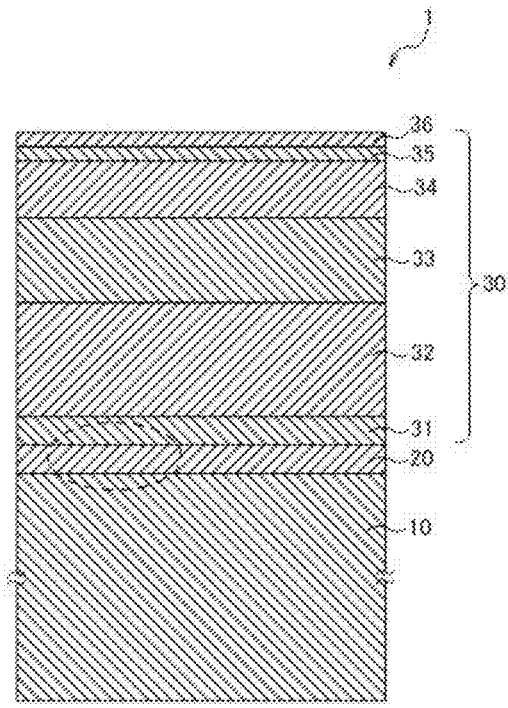
FIG. 1 is a drawing showing a configuration of a nitride semiconductor substrate as related to one embodiment of the present invention.
Figure 2:
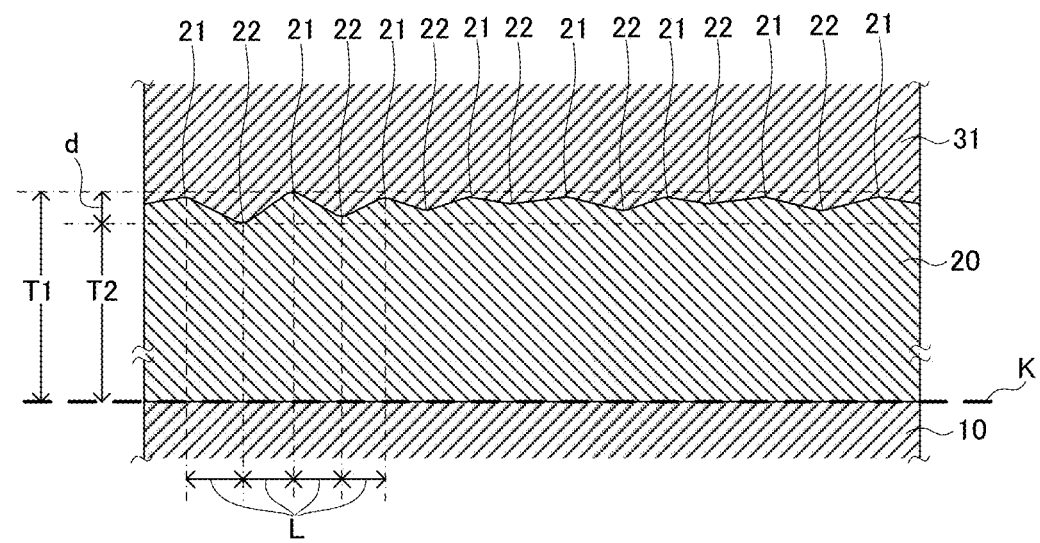
FIG. 2 is a drawing shown by enlarging part of the nitride semiconductor substrate shown in FIG. 1.

FIG. 1 is a drawing showing a configuration of a nitride semiconductor substrate 1 as related to one embodiment of the present invention. FIG. 2 is a drawing shown by enlarging a part shown by a dashed line circle in FIG. 1. In addition, FIG. 1 and FIG. 2 conceptually represent structure, in which a dimension or the like is different from actual structure.

The nitride semiconductor substrate 1 has a first layer 20 formed on one principal plane of a single crystal substrate 10, and a nitride semiconductor layer 30 formed on the first layer 20, for example. The nitride semiconductor substrate 1 is preferably used for a power system transistor such as a high electron mobility transistor, and FIG. 1 shows one configuration example when the nitride semiconductor substrate 1 is used for the high electron mobility transistor.

The single crystal substrate 10 is constituted of a so-called different kind of substrate as constituted of a material different from the material of the nitride semiconductor. Specific examples of the single crystal substrate 10 include a Si single crystal substrate, a hexagonal SiC substrate, a substrate in which a cubic SiC layer is formed on the Si single crystal substrate, or a sapphire substrate. Above all, if use of the Si single crystal substrate is contemplated, because a large diameter and cost reduction can be achieved, and specific resistance and hardness can be changed suitably and with high accuracy by changing a concentration of impurities and a concentration of oxygen, such a case is preferable. A publicly known substrate for a semiconductor can be widely applied to the Si single crystal substrate. Each specification of a crystal growth method, a plane orientation, an oxygen concentration, an impurities concentration, a PN type, plane roughness, a thickness and the like can be appropriately set depending on requirements of the nitride semiconductor substrate 1 to be designed.

Moreover, the single crystal substrate 10 is preferably a substrate having one principal plane in which an off angle within the range of 0.15° or more and 1° or less from a (111) plane or (0001) plane is formed, for example. For example, for the Si single crystal substrate or the cubic SiC layer is formed on the Si single crystal substrate, the substrate having one principal plane in which the off angle within the range of 0.15° or more and 1° or less from the (111) plane is formed is preferable. For the hexagonal SiC substrate, the substrate having one principal plane in which the off angle within the range of 0.15° or more and 1° or less from the (0001) plane is formed is preferable.

The reason is that, if the one principal plane on the single crystal substrate 10 has such an off angle, in comparison with a case where the plane has no off angle, regularity of a step is further kept, and the first layer 20 having superb flatness can be formed. Moreover, on the other hand, another reason is that, if the off angle is excessively large, the flatness is adversely affected under influence of a large step difference. Then, if the off angle within the range of 0.15° or more and 1° or less from the (111) plane or (0001) plane is formed, a concave-convex shape on the first layer 20 having satisfactory flatness, which is characteristic to the present invention to be mentioned later, can be formed.

The first layer 20 is formed in contact with the one principal plane of the single crystal substrate 10 by epitaxial growth. The first layer 20 is preferably constituted of AlN, SiC or SiN. Above all, if the first layer 20 constituted of AlN is contemplated to be formed on the Si single crystal substrate, because a satisfactory nitride semiconductor layer 30 can be formed thereon, such a case is further preferable.

A surface of the first layer 20 on a side of the nitride semiconductor layer 30 is preferably flat. Specifically, upon selecting arbitrary three places in a radial direction from a cross section cleaved in a diameter portion on the one principal plane of the nitride semiconductor substrate, and observing an interface between the first layer 20 and the nitride semiconductor layer 30 for each by taking a width of at least 500 nm in the radial direction, a value is within the range of 6 nm or more and 15 nm or less in a mean value of the three places with regard to a difference d between a maximum height T1 of a convex top portion 21 of the first layer 20 and a minimum height T2 of a concave bottom portion 22 thereof based on the one principal plane of the single crystal substrate 10, in a thickness direction from the single crystal substrate 10 toward the nitride semiconductor layer 30. Moreover, a value is within the range of 10 nm or more and 25 nm or less in the mean value of the three places with regard to an interval L in the radial direction between the convex top portion 21 and the concave bottom portion 22 adjacent to each other in cross sections in the three places.

Here, the expression "selecting arbitrary three places in a radial direction from a cross section cleaved in a diameter portion on the one principal plane of the nitride semiconductor substrate" means that the three places in total, including a central portion and portions on inner sides by 10 mm from both peripheral ends on a diameter of the one principal plane are preferably selected, for example. Obviously, a place other than the above may be selected, and the number of places to be selected may be increased to three or more places.

In observing the cross sections of the places selected as described above, a thickness direction is preferably secured so as to include the interface between the first layer 20 and the single crystal substrate 10, and part of the nitride semiconductor layer 30 formed on the first layer 20. Then, with regard to "radial direction" in observation according to the present invention, the interface between the single crystal substrate 10 and the first layer 20 is taken as a reference plane K as shown in FIG. 2, and a direction in parallel with a line obtained by viewing the reference plane K from the cross section is regarded as the radial direction.

The expression "observing by taking a width of at least 500 nm in the radial direction" means that the width of 500 nm from an arbitrary point along the radial direction as defined above is taken, and applied as an observation range. As the width, at least 500 nm is secured in taking into account a fluctuation of sampling. Obviously, the observation may be performed at a width more than the above.

In the observation, a transmission electron microscope (TEM; hereinafter, referred to as TEM), STEM, a scanning electron microscope (SEM; hereinafter, referred to as SEM), or any other means capable of observing the cross section with high magnification can be appropriately used.

Thus, the difference d is specified between the maximum height T1 of the convex top portion 21 of the first layer 20 and the minimum height T2 of the concave bottom portion 22 thereof, and the interval L in the radial direction is specified between the convex top portion 21 and the concave bottom portion 22 adjacent to each other, because, for example, if the convex portion and the concave portion having a size exceeding 15 nm and having an acute angle exist on the surface of the first layer 20, a dislocation easily progresses in a lamination direction onto an upper side, with at least either the convex top portion 21 or the concave bottom portion 22 as a starting point, easily resulting in spreading dislocation. In the nitride semiconductor substrate 1, because the convex portion and the concave portion have a size within 15 nm and an obtuse angle, for example, the very fine uneven surface is formed in which the dislocations progress obliquely to the nitride semiconductor layer 30 to be formed on the first layer 20, and are bent on the way, and joined with each other, and dislocation progress extending upward can be reduced.

If the value is within the range of 6 nm or more and 8 nm or less in the mean value of the three places with regard to the difference d between the maximum height T1 of the convex top portion 21 and the minimum height T2 of the concave bottom portion 22, such a case is further preferable. The reason is that, if the first layer 20 is produced such that the difference d becomes smaller than 6 nm in the mean value of the three places, the dislocations become hard to progress obliquely to the lamination direction and even with the difference d of 6 nm or more, occurrence of the threading dislocation can be suppressed. Here, the maximum height T1 of the convex top portion 21 and the minimum height T2 of the concave bottom portion 22 each refer to a height from the reference plane K.

In addition, if the value exceeds 25 nm in the mean value of the three places with regard to the interval L in the radial direction between the convex top portion 21 and the concave bottom portion 22 adjacent to each other, a probability of causing a new convex portion or concave portion is enhanced between the convex top portion 21 and the concave bottom portion 22 adjacent to each other, in particular in a vapor phase epitaxial method. More specifically, because operation of taking a large interval L described above while keeping a small difference d is not practical, the interval L is preferably adjusted to 25 nm or less.

Moreover, when the first layer 20 is constituted of AlN, a FWHM of an X-ray rocking curve on a (002) plane is preferably within the range of 1,000 arcsec or more and 1900 arcsec or less. The FWHM is further preferably set within the range of 1,300 arcsec or more and 1,700 arcsec or less. The reason is that, if the FWHM of an X-ray rocking curve on the (002) plane is set to be 1,900 arcsec or less and further 1,700 arcsec or less, the dislocation existing in the first layer 20 is reduced, and the dislocation propagating into the nitride semiconductor layer 30 can be reduced. On the other hand, if the FWHM of an X-ray rocking curve on the (002) plane is set to be 1,000 arcsec or more and further 1,300 arcsec or more, stress generated due to a difference of a coefficient of thermal expansion between the single crystal substrate 10 and the nitride semiconductor layer 30 is dispersed by the dislocation existing in the first layer 20, the lattice misalignment can be relieved, and warpage of the nitride semiconductor substrate 1 can be reduced.

Further, when the first layer 20 is constituted of AlN, the Si concentration is preferably within the range of $1 \times 10^{16}$ atoms/cm$^3$ or more and $1 \times 10^{17}$ atoms/cm$^3$ or less. The reason is that, if the Si concentration in AlN is high, existence of Si in AlN causes trapping of free electrons in a defect occurred in the vicinity of Si, which is considered to serve as a cause of deteriorating the current collapse. The above-described Si concentration is particularly effective, when the Si single crystal substrate is used as the single crystal substrate 10.

In addition, the Si concentration is preferably as low as possible, but a value lower than $1 \times 10^{16}$ atoms/cm$^3$ is a measurement limit of a measurement technique (for example, second ion mass spectrometry (SIMS; hereinafter, referred to as SIMS)) of elements generally applied, and realizing of such a Si concentration in a metal organic chemical vapor deposition (MOCVD; hereinafter, referred to as MOCVD) method is not practical, either. In taking into account the situations, the Si concentration may be $1 \times 10^{16}$ atoms/cm$^3$ or more, but even if the concentration is not so low, the Si concentration can fully allow such a level as $5 \times 10^{16}$ atoms/cm$^3$ or more.

A thickness of the first layer 20 is preferably within the range of 80 nm or more and 500 nm or less, for example. The reason is that, if the thickness is lower than 80 nm, crystallinity of the nitride semiconductor layer 30 to be formed on the first layer 20 is reduced, and the leak electric current is increased, and if the thickness is larger than 500 nm, a crack is liable to occur. A further preferred thickness is within the range of 120 nm or more and 200 nm or less.

The nitride semiconductor layer 30 is formed on the first layer 20 by the epitaxial growth. Layer structure of the nitride semiconductor layer 30 is appropriately designed according to an intended purpose. As one example, as shown in FIG. 1, the nitride semiconductor layer 30 has a second layer 31 formed on the first layer 20 and constituted of $Al_xGa_{1-x}N$ (0<x<1), a third layer 32 formed on the second layer 31 and constituted of a multi-layer prepared by alternately and repeatedly laminating the AlN layer and the GaN layer, a fourth layer 33 formed on the third layer 32 and constituted of GaN, an active layer 34 formed on the fourth layer 33 and constituted of GaN, an electron supply layer 35 formed on the active layer 34 and constituted of $Al_yGa_{1-y}N$ (0<y<1) and a cap layer 36 formed on the electron supply layer 35 and constituted of GaN.

The nitride semiconductor substrate 1 can be formed by applying the MOCVD method by allowing the epitaxial growth of the first layer 20 and the nitride semiconductor layer 30 on the single crystal substrate 10, for example. On the above occasion, structure of the first layer 20 is controlled by adjusting temperature, kinds of raw materials, a flow quantity, a supply time and the like. For example, the first layer 20 may be laminated by dividing stages into two or more stages in which a growth temperature is different.

Thus, according to the present embodiment, the value is set to be 6 nm or more and 15 nm or less in the mean value of the three places with regard to the difference d between the maximum height T1 of the convex top portion 21 and the minimum height T2 of the concave bottom portion 22 of the first layer 20. In addition, the value is set to be 10 nm or more and 25 nm or less in the mean value of the three places with regard to the interval L in the radial direction between the convex top portion 21 and the concave bottom portion 22 adjacent to each other. Therefore, the very fine uneven surface makes dislocations turn the propagation direction obliquely to the nitride semiconductor layer. Therefore, the dislocations are bent on the way, and joined with each other, and the dislocation progress extending upward can be reduced. Thus, the leak electric current can be reduced, and the withstand voltage can also be improved.

Moreover, if the first layer 20 is constituted of AlN, and the FWHM of an X-ray rocking curve on the (002) plane is set to be 1,900 arcsec or less, the dislocation existing in the first layer 20 is reduced, and the dislocation propagating into the nitride semiconductor layer 30 can be reduced. Thus, the leak electric current can be further reduced. Further, if the FWHM of an X-ray rocking curve on the (002) plane is set to be 1,000 arcsec or more, the lattice misalignment can be relieved by the dislocation existing in the first layer 20, and the warpage of the nitride semiconductor substrate 1 can be reduced.

In addition thereto, if the first layer 20 is constituted of AlN, and the Si concentration is set to be $1 \times 10^{16}$ atoms/cm$^3$ or more and $1 \times 10^{17}$ atoms/cm$^3$ or less, the deterioration of the current collapse can be effectively suppressed.

EXAMPLES

Example 1

A nitride semiconductor substrate 1 shown in FIG. 1 was prepared in the following steps. First, as a single crystal substrate 10, a Si single crystal substrate was arranged, the substrate having 6 inches in diameter, 0.01 Ωcm in specific resistance, 625 μm in thickness at one point in a substrate center, P type, and having a principal plane on which an off angle of 0.2° from a (111) plane was formed. Subsequently, the single crystal substrate 10 was set in an MOCVD device, and as raw materials, trimethyl gallium (TMG), trimethyl aluminum (TMA), NH$_3$, methane were used. The raw materials were properly used appropriately according a layer to be laminated. Each layer was formed by vapor phase epitaxy at a composition and a film thickness shown in Table 1 by applying a vapor phase epitaxy temperature of 1,000° C. as a standard. In addition, the composition and the film thickness of each layer was adjusted to each value as set by selection of each raw material, and finely adjusting a flow quantity, a supply time, a growth pressure and a growth temperature.

TABLE 1

| Layer | Numerical reference in drawing | Composition | Thickness (nm) |
|---|---|---|---|
| Active layer | 34 | GaN | 700 |
| Fourth layer | 33 | GaN | 1,300 |
| Third layer | 32 | Laminating fifty times by alternately repeating lamination of AlN layer and GaN layer | 2,500 |
| Second layer | 31 | Al$_x$Ga$_{1-x}$N (x = 0.15) | 300 |
| First layer | 20 | AlN | 100 |

Figure 3:
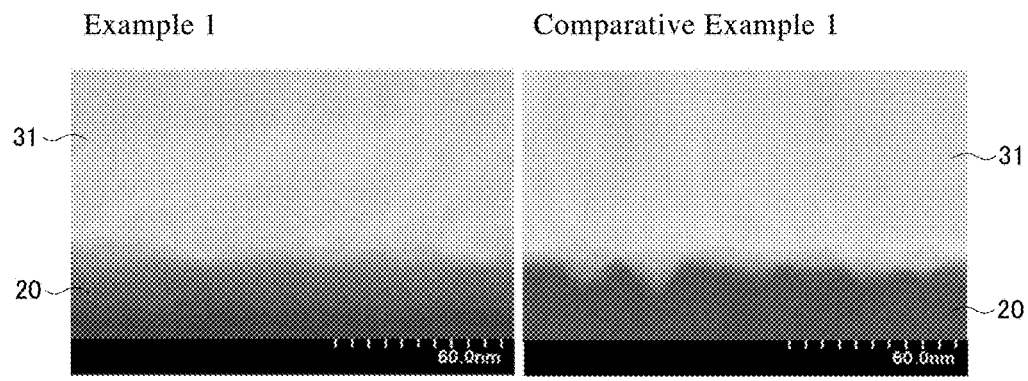
FIG. 3 is a high-angle annular dark-field (HAADF; hereinafter, referred to as HAADF) scanning transmission electron microscope (STEM; hereinafter, referred to as STEM) image showing cross-sectional structure of a nitride semiconductor substrate in Example 1 of the present invention.
Figure 4:
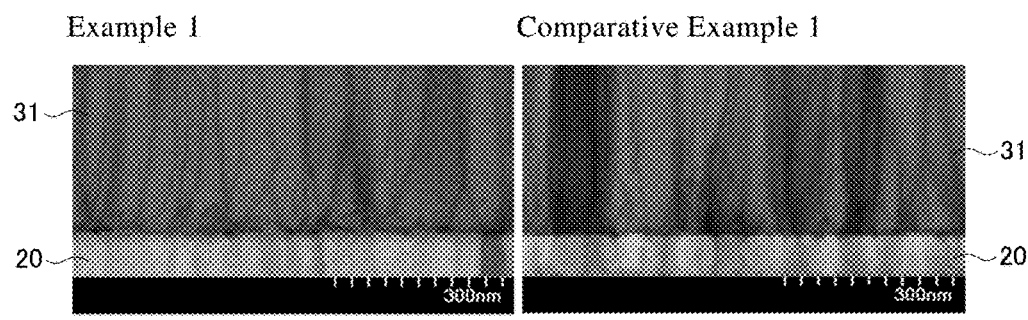
FIG. 4 is an STEM bright-field image shown by reducing a size of the cross-sectional structure of the nitride semiconductor substrate shown in FIG. 3.
Figure 5:
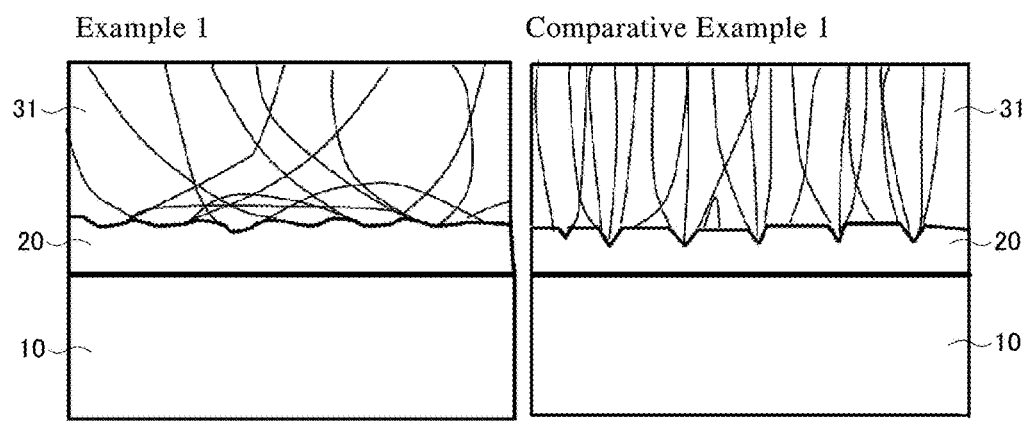
FIG. 5 is a schematic drawing shown by emphasizing dislocation lines in the cross-sectional structure of the nitride semiconductor substrate shown in FIG. 4.

The thus prepared nitride semiconductor substrate 1 was cleaved on one arbitrary diameter, and then observation was carried out by STEM on structure in an interface between a first layer 20 and a nitride semiconductors 30 in cross sections in three places in total, including a central portion on one principal plane on the substrate and portions on inner sides by 10 mm from both peripheral ends thereof. FIG. 3 and FIG. 4 show STEM images of the cross sections in the central portion, and simultaneously FIG. 5 shows a schematic drawing representing dislocation lines for the STEM images of the cross sections in FIG. 4. As shown in FIG. 3, a surface of the first layer 20 was significantly flat. Moreover, as shown in FIG. 4 and FIG. 5, dislocations were found to progress obliquely from the first layer 20, bent on the way, and joined with each other.

Moreover, examination was carried out by STEM on 500 nm-wide cross sections in the three places with regard to a difference d between a maximum height T1 of a convex top portion 21 and a minimum height T2 of a concave bottom portion 22 of the first layer 20, and an interval L in a radial direction between the convex top portion 21 and the concave bottom portion 22 adjacent to each other. As a result, a value was 7 nm in a mean value of the three places with regard to the difference d between the maximum height T1 of the convex top portion 21 and the minimum height T2 of the concave bottom portion 22 of the first layer 20, and a value was 12 nm in a mean value of the three places with regard to the interval L in the radial direction between the convex top portion 21 and the concave bottom portion 22 adjacent to each other. The results are shown in Table 2.

Further, when examination was carried out on the first layer 20 by X-ray diffractometer with regard to a FWHM of an X-ray rocking curve on a (002) plane, the FWHM was 1,600 arcsec. In addition thereto, when a Si concentration was measured on the first layer 20 by SIMS, the concentration was $5 \times 10^{16}$ atoms/cm$^3$. These results are also shown simultaneously in Table 2.

Furthermore, a withstand voltage was evaluated on the thus prepared nitride semiconductor substrate 1. With regard to the withstand voltage, a device was assumed in a longitudinal direction. Grooves in a recess gate region and an element separation region were formed by dry etching, and as a gate electrode, a 2 mm-diameter Au electrode was formed on a side of an active layer 34, and as a source electrode and a drain electrode, 0.5 mm-diameter Al electrodes were formed, and as a back electrode, an Al electrode was formed on a back surface side of the single crystal substrate 10 by vacuum deposition, respectively, and measurement was carried out by applying an electric field by using a commercial curve tracer. Then, a case where the withstand voltage was 650 V or more was taken as pass.

As a result, the withstand voltage was 740 V, and a good result was obtained. The results are also simultaneously shown in Table 2.

TABLE 2

| | Mean value of difference d (nm) | Interval L (nm) | FWHM of AlN(002) (arcsec) | Si concentration (atoms/cm$^3$) | Withstand voltage (V) |
|---|---|---|---|---|---|
| Example 1 | 7 | 12 | 1,600 | $5 \times 10^{16}$ | 740 |
| Comparative Example | 20 | 50 | 2,500 | $5 \times 10^{16}$ | 600 |

Comparative Example 1

A nitride semiconductor substrate was prepared in a manner similar to Example 1 for others except that structure of a first layer was controlled by adjusting a growth temperature, kinds of raw materials, a flow quantity or a supply time upon forming the first layer. In addition, a composition of the first layer in Comparative Example was adjusted to be the same with the composition in Example 1, and a thickness of the first layer was also adjusted to be 100 nm. Also in Comparative Example 1, examination was carried out, in a manner similar to Example 1, on structure of an interface between the first layer and the nitride semiconductor layer, a FWHM of an X-ray rocking curve on a (002) plane of the first layer, a Si concentration of the first layer, and a withstand voltage of the nitride semiconductor substrate 1. The results are shown in FIG. 3 to FIG. 5 and simultaneously in Table 2.

As shown in FIG. 3, a large pit-shaped concave portion was found on a surface of the first layer in Comparative Example 1. Moreover, as shown in FIG. 4 and FIG. 5, in the nitride semiconductor layer in Comparative Example 1, dislocations were found to progress in a lamination direction, with a convex top portion and a concave bottom portion of the first layer as a starting point, and a quantity of the dislocation density was found to be larger in comparison with Example 1.

Moreover, as shown in Table 2, a value was 20 nm in a mean value in three places with regard to a difference d between a maximum height T1 of a convex top portion 21 and a minimum height T2 of a concave bottom portion 22, and a value was 50 nm in a mean value in the three places with regard to an interval L in a radial direction between the convex top portion 21 and the concave bottom portion 22 adjacent to each other. In addition, the FWHM of an X-ray rocking curve on the (002) plane was 2,500 arcsec, the Si concentration of the first layer was $5\times10^{16}$ atoms/cm$^3$, and the withstand voltage was 600 V.

Results in Example 1 and Comparative Example 1

As known from the results in Example 1 and Comparative Example 1, the withstand voltage of the nitride semiconductor substrate 1 was found to be improvable, if the value is set to 6 nm or more and 15 nm or less in the mean value in the three places with regard to the difference d between the maximum height T1 of the convex top portion 21 and the minimum height T2 of the concave bottom portion 22 of the first layer 20, and the value is set to 10 nm or more and 25 nm or less nm in the mean value of the three places with regard to the interval L in the radial direction between the convex top portion 21 and the concave bottom portion 22 adjacent to each other.

Here, a specific example of one preferred aspect in carrying out the present invention include a two-stage epitaxial method for an MN of the first layer 20, in which a first layer thickness is formed at a first temperature, and then a second layer thickness is formed at a second temperature. More specifically, the mean value of the above difference d can be arbitrarily set to some extent by appropriate adjusting the first temperature, the second temperature, the first layer thickness and the second layer thickness. In addition, lamination may be made in three stages or more, when necessary.

In Example 1, the first temperature is 750° C., the first layer thickness is 30 nm, the second temperature is 1,050° C., and the second layer thickness is 70 nm. In Comparative Example 1, the first temperature is 750° C., the first layer thickness is 30 nm, the second temperature is 900° C., and the second layer thickness is 70 nm.

Example 2

A nitride semiconductor substrate in Example 2 was prepared in a manner similar to Example 1 except that a first temperature was adjusted to 750° C., a first layer thickness was adjusted to 50 nm, the second temperature was adjusted to 1,050° C., and the second layer thickness was adjusted to 50 nm.

Example 3

A nitride semiconductor substrate in Example 3 was prepared in a manner similar to Example 1 except that a the first temperature was adjusted to 750° C., the first layer thickness was adjusted to 5 nm, the second temperature was adjusted to 1,050° C., and the second layer thickness was adjusted to 95 nm.

Also with regard to Examples 2 and 3, evaluation was carried out in a manner similar to Example 1. The results are shown in Table 3 together with the result in Example 1.

TABLE 3

| | Mean value of difference d (nm) | Interval L (nm) | FWHM of AlN(002) (arcsec) | Si concentration (atoms/cm$^3$) | Withstand voltage (V) |
|---|---|---|---|---|---|
| Example 1 | 7 | 12 | 1,600 | $5 \times 10^{16}$ | 740 |
| Example 2 | 10 | 17 | 1,900 | $3 \times 10^{16}$ | 700 |
| Example 3 | 13 | 21 | 1,900 | $8 \times 10^{16}$ | 660 |

As shown in Table 3, the withstand voltage was somewhat lower in Example 2 in comparison with Example 1, and the withstand voltage was also lower in Example 3 in comparison with Example 2. Further, the FWHM of an X-ray rocking curve of the (002) plane developed a slightly higher tendency in both of Examples 2 and 3 in comparison with Example 1.

The above results reasonably show that the withstand voltage or crystallinity has a somewhat decreasing tendency, as the values become larger in comparison with Example 1 with regard to the mean value of the difference d between the maximum height T1 of the convex top portion 21 and the minimum height T2 of the concave bottom portion 22 of the first layer 20, and the mean value of the interval L in the radial direction between the adjacent convex top portion 21 and the concave bottom portion 22.

As described above, the present invention is described by quoting the embodiments, but the present invention is not limited to the above embodiments, and can be modified in various manners. For example, the layer structure of the nitride semiconductor layer 30 is specifically described in the embodiment, but the nitride semiconductor substrate 1 may be constituted so as to have any other layer structure. Moreover, the case where the nitride semiconductor substrate 1 is used for the power system transistor such as the high electron mobility transistor is described in the embodiment, but any other nitride compound semiconductor element can also be used in a similar manner.

INDUSTRIAL APPLICABILITY

A nitride semiconductor substrate can be preferably used for a power system transistor such as a high electron mobility transistor.

REFERENCE SIGNS LIST

1 . . . Nitride semiconductor substrate, 10 . . . single crystal substrate, 20 . . . first layer, 21 . . . convex top portion, 22 . . . concave bottom portion, 30 . . . nitride semiconductor layer, 31 . . . second layer, 32 . . . third layer, 33 . . . fourth layer, 34 . . . active layer, 35 . . . electron supply layer, 36 . . . cap layer, T1 . . . maximum height, T2 . . . minimum height, d . . . difference between T1 and T2, L . . . interval between a convex top portion and a concave bottom portion adjacent to each other in a radial direction, K . . . reference plane

The invention claimed is:

1. A nitride semiconductor substrate comprising a first layer formed on one principal plane of a single crystal substrate, and a nitride semiconductor layer formed on the first layer, wherein,
   upon selecting arbitrary three places in a radial direction from a cross section cleaved in a diameter portion on one principal plane of the nitride semiconductor substrate, and observing an interface between the first layer and the nitride semiconductor layer for each by taking a width of at least 500 nm in the radial direction, a value is within the range of 6 nm or more and 15 nm or less in a mean value of the three places with regard to a difference between a maximum height of a convex top portion of the first layer and a minimum height of a concave bottom portion thereof based on the one principal plane of the single crystal substrate, in a thickness direction from the single crystal substrate toward the nitride semiconductor layer, and
   a value is within the range of 10 nm or more and 25 nm or less in the mean value of the three places with regard to an interval in the radial direction between the convex top portion and the concave bottom portion adjacent to each other in cross sections in the three places.

2. The nitride semiconductor substrate according to claim 1, wherein a value is within the range of 6 nm or more and 8 nm or less in the mean value of the three places with regard to the difference between the maximum height of the convex top portion of the first layer and the minimum height of the concave bottom portion thereof.

3. The nitride semiconductor substrate according to claim 1, wherein the first layer comprises AlN.

4. The nitride semiconductor substrate according to claim 3, wherein a FWHM of an X-ray rocking curve on a (002) plane of the first layer is within the range of 1,000 arcsec or more and 1,900 arcsec or less.

5. The nitride semiconductor substrate according to claim 3, wherein the single crystal substrate comprises Si, and a Si concentration of the first layer formed on the single crystal substrate is within the range of $1 \times 10^{16}$ atoms/cm$^3$ or more and $1 \times 10^{17}$ atoms/cm$^3$ or less.

6. The nitride semiconductor substrate according to claim 1, wherein the single crystal substrate has one principal plane in which an off angle of 0.15° or more and 1° or less is formed from a (111) plane or (0001) plane.

* * * * *